(12) United States Patent
Mirzaei et al.

(10) Patent No.: US 7,840,197 B2
(45) Date of Patent: Nov. 23, 2010

(54) HIGHLY LINEAR AND VERY LOW-NOISE DOWN-CONVERSION MIXER FOR EXTRACTING WEAK SIGNALS IN THE PRESENCE OF VERY STRONG UNWANTED SIGNALS

(75) Inventors: Ahmad Mirzaei, Los Angeles, CA (US); Hooman Darabi, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 672 days.

(21) Appl. No.: 11/833,048

(22) Filed: Aug. 2, 2007

(65) Prior Publication Data
US 2009/0036087 A1 Feb. 5, 2009

(51) Int. Cl.
*H04B 1/04* (2006.01)
*H04K 3/00* (2006.01)
(52) U.S. Cl. .............. 455/126; 455/127.1; 327/113; 330/250
(58) Field of Classification Search .......... 455/126, 455/127.1; 330/250, 252, 253, 257; 327/113, 327/116, 117
See application file for complete search history.

(56) References Cited

U.S. PATENT DOCUMENTS 5,327,583 A * 7/1994 Yamada et al. ............ 455/572
7,672,643 B2 * 3/2010 Loh ......................... 455/63.1
2005/0275429 A1 * 12/2005 Khan et al. ................. 326/81
2007/0002968 A1 * 1/2007 Pan ........................... 375/298

OTHER PUBLICATIONS

U.S. Appl. No. 11/825,415, filed Jul. 6, 2007, Nullification of Transmitter Noise at Receive Signal Frequency, Ahmad Mirzaei, Hooman Darabi.

* cited by examiner

*Primary Examiner*—Lee Nguyen
(74) *Attorney, Agent, or Firm*—McAndrews Held & Malloy, Ltd.

(57) ABSTRACT

A highly linear and very low-noise down-conversion mixer for extracting weak signals in the presence of very strong unwanted signals is disclosed. Aspects of an embodiment may include a source follower circuit in a transmitter front end of a mobile terminal. The source follower circuit may receive RF signals prior to the RF signals being amplified by a power amplifier for transmission. The RF signals may comprise in-phase and quadrature components. The source follower circuit may generate output RF voltage signals, and communicate the output RF voltage signals to a switching circuit via a coupling capacitor. The switching circuit may down-convert the communicated output RF voltage signals to generate differential baseband signals. The capacitance of the coupling capacitor may be changed to change gain and/or linearity of the differential baseband signals. Each of the differential baseband signals may be low-pass filtered to attenuate higher frequencies.

28 Claims, 6 Drawing Sheets

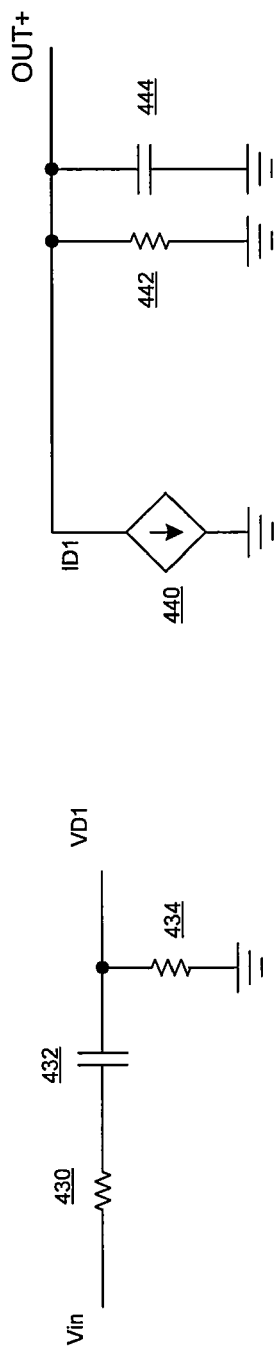
FIG. 4C
FIG. 4B
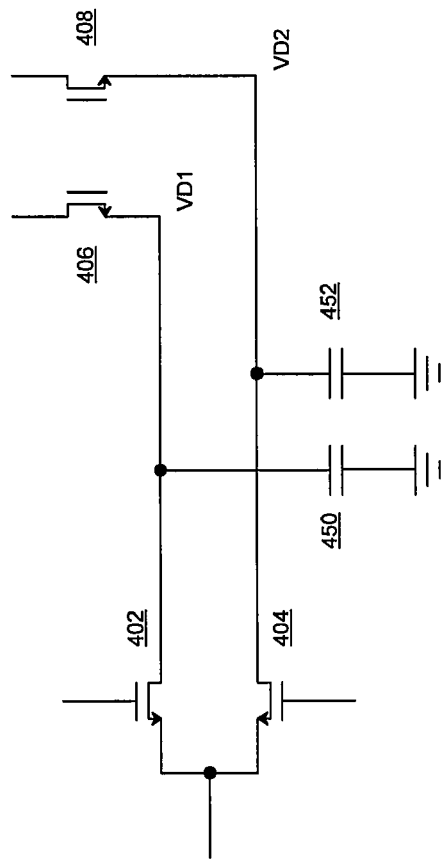
FIG. 4D

HIGHLY LINEAR AND VERY LOW-NOISE DOWN-CONVERSION MIXER FOR EXTRACTING WEAK SIGNALS IN THE PRESENCE OF VERY STRONG UNWANTED SIGNALS

CROSS-REFERENCE TO RELATED APPLICATIONS/INCORPORATION BY REFERENCE

[Not Applicable.]

FEDERALLY SPONSORED RESEARCH OR DEVELOPMENT

[Not Applicable]

MICROFICHE/COPYRIGHT REFERENCE

[Not Applicable]

FIELD OF THE INVENTION

Certain embodiments of the invention relate to wireless communication. More specifically, certain embodiments of the invention relate to a highly linear and very low-noise down-conversion mixer for extracting weak signals in the presence of very strong unwanted signals.

BACKGROUND OF THE INVENTION

In some conventional systems, a transmitter may transmit radio frequency (RF) signals via direct up-conversion or indirect up-conversion. During direct up-conversion, the RF signals may be generated by directly up-converting the baseband signals to RF signals. During indirect up-conversion, the RF signals are generated by up-converting baseband signals to intermediate frequency (IF) signals, and then further up-converting the IF signals to RF signals. The baseband signals may be up-converted to RF signals by using local oscillator (LO) signals that may be at a desired RF carrier frequency. The baseband signal, or the IF signal, may be mixed with the LO signal to generate the RF signal. However, amplifying the RF signal in preparation for transmission may allow a relatively strong RF transmit signal to leak to RF receiver circuitry, where portions of the RF signal may provide blocking for the received RF signals. For example, the RF transmit signal may comprise frequencies that may interfere with received RF signals.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A system and/or method is provided for a highly linear and very low-noise down-conversion mixer for extracting weak signals in the presence of very strong unwanted signals, substantially as shown in and/or described in connection with at least one of the figures, as set forth more completely in the claims.

Various advantages, aspects and novel features of the present invention, as well as details of an illustrated embodiment thereof, will be more fully understood from the following description and drawings.

BRIEF DESCRIPTION OF SEVERAL VIEWS OF THE DRAWINGS

FIG. 4B is a simplified diagram that shows an equivalent circuit for a portion of the exemplary highly linear, low-noise circuit shown in FIG. 4A.

FIG. 4C is a simplified diagram that shows an equivalent circuit for a portion of the exemplary highly linear, low-noise circuit shown in FIG. 4A.

FIG. 4D is an exemplary diagram that shows further filtering provided for the exemplary highly linear, low-noise circuit shown in FIG. 4A, in accordance with an embodiment of the invention.

DETAILED DESCRIPTION OF THE INVENTION

Certain embodiments of the invention may be found in a highly linear and very low-noise down-conversion mixer for extracting weak signals in the presence of very strong unwanted signals. Exemplary aspects of the invention may comprise a source follower circuit, in a transmitter front end of, for example, a mobile terminal, which may receive RF signals prior to the RF signals being amplified by a power amplifier for transmission. The RF signals may comprise in-phase and quadrature components. The source follower circuit may be enabled to generate output RF voltage signals, and communicate the output RF voltage signals to a switching circuit via a coupling capacitor. The switching circuit may be enabled to down-convert the communicated output RF voltage signals to generate differential baseband signals. The capacitance of the coupling capacitor may be changed to trade gain and/or linearity to the noise of the system.

The mobile terminal may operate in accordance with, for example, a CDMA standard. Accordingly, the mobile terminal may transmit at a frequency that is 190 MHz below a corresponding receive frequency. The switching circuit may, for example, down-convert to DC the receive frequency for the mobile terminal. Each of the differential baseband signals may be low-pass filtered to attenuate higher frequency components including portions of the strong transmitter signal.

Figure 1:
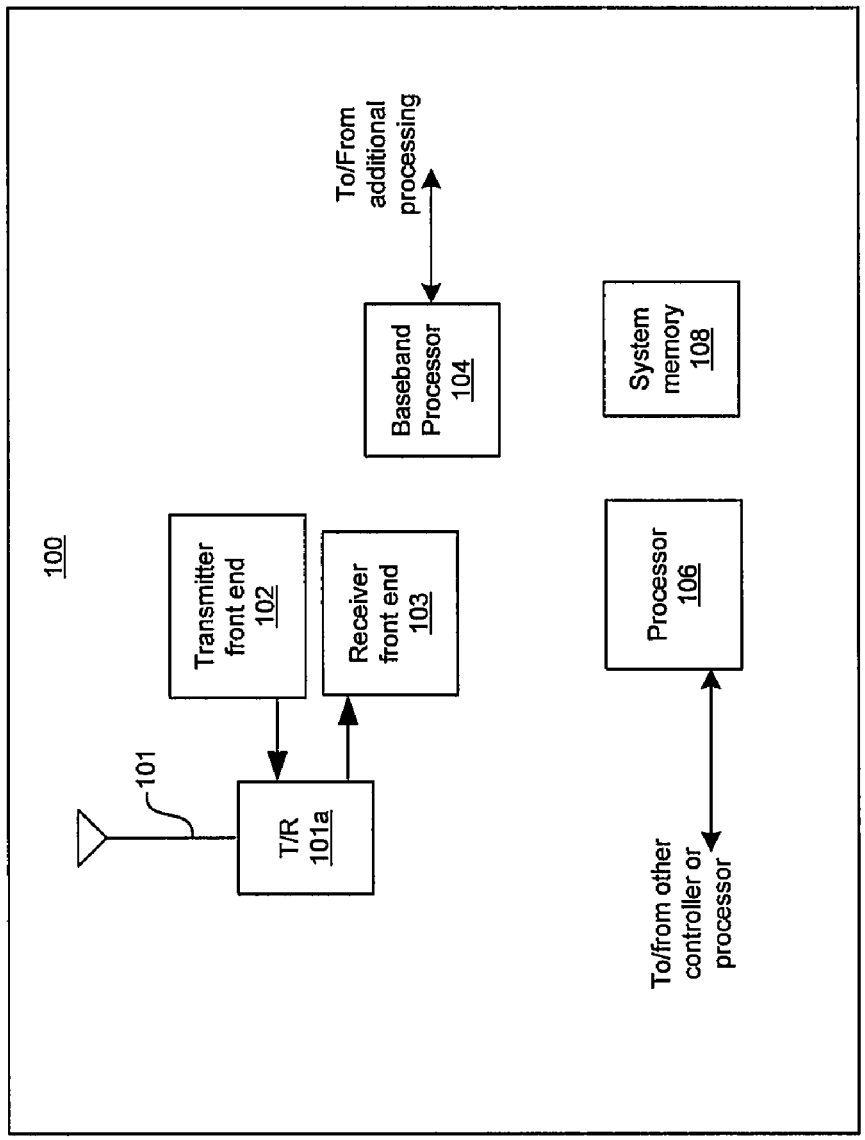
FIG. 1 is a block diagram of an exemplary wireless system, which may be utilized in connection with an embodiment of the invention.

FIG. 1 is a block diagram of an exemplary wireless system, which may be utilized in connection with an embodiment of the invention. Referring to FIG. 1, a mobile terminal 100 may comprise a transmitting antenna 101, a transmitter/receiver switch 101a, a transmitter front end 102, a receiver front end 103, a baseband processor 104, a processor 106, and a system memory 108. The transmitter/receiver switch 101a may comprise suitable circuitry that enables the antenna 101 to be used for both receiving and transmitting signals. The transmitter front end 102 may comprise suitable logic, circuitry, and/or code that may be adapted to upconvert baseband signals directly to RF signals and to transmit the RF signals via a transmitting antenna 101. The transmitter front end 102 may also be adapted to upconvert a baseband signal to an IF signal, and/or upconvert the IF signal to an RF signal and then transmit the RF signal via the transmitting antenna 101. The transmitter front end 102 may be adapted to execute other functions, for example, filtering the baseband signal, amplifying the baseband signal, filtering RF signals, and/or amplifying RF signals.

The receiver front end 103 may comprise suitable logic, circuitry, and/or code that may be adapted to downconvert a RF signal directly to a baseband signal for further processing. The receiver front end 103 may also be adapted to downconvert a RF signal to an IF signal, and/or downconvert the IF signal to a baseband signal for further processing. The receiver front end 103 may be adapted to execute other functions, for example, filtering the baseband signal, and/or amplifying the baseband signal.

The baseband processor 104 may comprise suitable logic, circuitry, and/or code that may be adapted to process baseband signals, for example, convert a digital signal to an analog signal, and/or vice-versa. The processor 106 may be any suitable processor or controller such as a CPU or DSP, or any type of integrated circuit processor. The processor 106 may comprise suitable logic, circuitry, and/or code that may be adapted to control the operations of the transmitter front end 102 and/or the baseband processor 104. For example, the processor 106 may be utilized to update and/or modify programmable parameters and/or values in a plurality of components, devices, and/or processing elements in the transmitter front end 102 and/or the baseband processor 104. Control and/or data information, which may include the programmable parameters, may be transferred from at least one controller and/or processor, which may be part of the mobile terminal 100, to the processor 106. Similarly, the processor 106 may be adapted to transfer control and/or data information, which may include the programmable parameters, to at least one controller and/or processor, which may be part of the mobile terminal 100.

The processor 106 may utilize the received control and/or data information, which may comprise the programmable parameters, to determine an operating mode of the transmitter front end 102. For example, the processor 106 may be utilized to select a specific frequency for a local oscillator, or a specific gain for a variable gain amplifier. Moreover, the specific frequency selected and/or parameters needed to calculate the specific frequency, and/or the specific gain value and/or the parameters needed to calculate the specific gain, may be stored in the system memory 108 via the processor 106. The information stored in system memory 108 may be transferred to the transmitter front end 102 from the system memory 108 via the processor 106. The system memory 108 may comprise suitable logic, circuitry, and/or code that may be adapted to store a plurality of control and/or data information, including parameters needed to calculate frequencies and/or gain, and/or the frequency value and/or gain value. In one embodiment of the invention, the processor 106 may be enabled to dynamically control operation of the transmitter front-end 102.

Figure 2B:
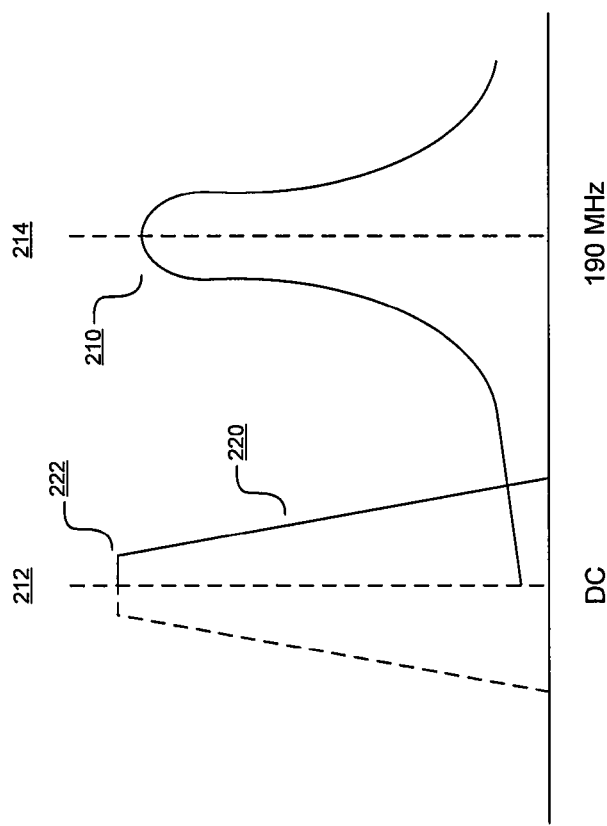
FIG. 2B is a diagram illustrating an exemplary frequency spectrum for RF signals in a transmit front-end of a wireless system after being down-converted to baseband.
Figure 2A:
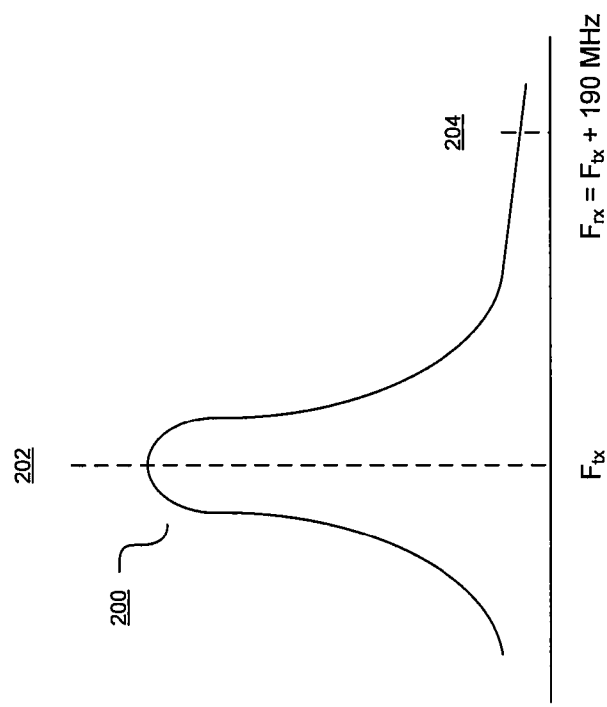
FIG. 2A is a diagram illustrating an exemplary frequency spectrum for RF signals in a transmit front-end of a wireless system.

FIG. 2A is a diagram illustrating an exemplary frequency spectrum for RF signals in a transmit front-end of a wireless system. Referring to FIG. 2A, there is shown a curve 200 of an exemplary frequency distribution of transmit RF signals generated by, for example, the transmitter front end 102. The frequency 202 may be a nominal center frequency for transmission by, for example, a CDMA mobile terminal, such as, for example, the mobile terminal 100. While the transmit RF signals may have been filtered to reduce signal strength outside the transmission bandwidth, there may still be frequencies where unwanted signals, or noise, exist. For example, the frequency 204 may be a center frequency for a receive channel for the mobile terminal 100. To conform, for example, to the CDMA standards, the frequency 204 may be 190 MHz above the frequency 202.

While the signal level at frequency 204 may be attenuated with respect to signal level at frequency 202, the noise at frequency 204 may leak to the receiver front end 103 due to finite isolation of the duplexer, such as, for example, the transmitter/receiver switch 101a. Accordingly, the signals received by the antenna 101 and communicated to the receiver front end 103 may be contaminated with the leaked noise from the transmitter front end 102. Accordingly, the receiver front end 103 may encounter more errors in processing the received signals than if there were no leaked signals from the transmitter front end 102.

FIG. 2B is a diagram illustrating an exemplary frequency spectrum for RF signals in a transmit front-end of a wireless system after being down-converted to baseband. Referring to FIG. 2B, there is shown a curve 210 of an exemplary frequency distribution of transmit RF signals generated by, for example, the transmitter front end 102, after the transmit RF signals shown with respect to FIG. 2A has been down-converted using a local oscillator signal whose frequency may be the frequency 204. Accordingly, the noise at frequency 204 may be centered about DC 212, while the transmit center frequency may be offset by 190 MHz.

The noise centered about DC 212 may be attenuated by filtering without too much adverse effect on the signals of interest for transmission about frequency 214, or 190 MHz. The filtered signals, which may comprise the relatively unaffected signals about the frequency 214, and attenuated signals about DC 212, may then be up-converted using a local oscillator signal whose frequency may be the frequency 204.

Figure 3A:
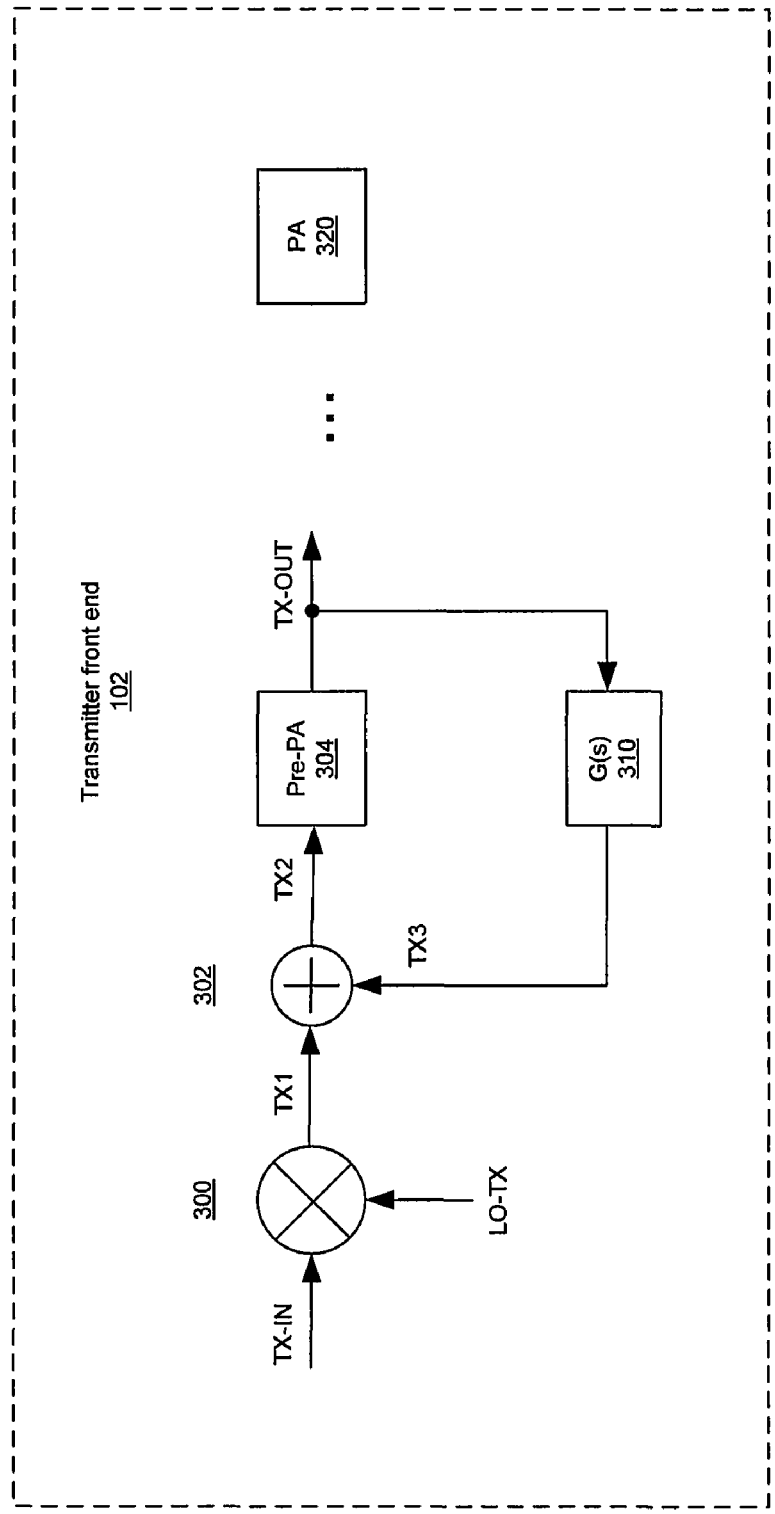
FIG. 3A is a block diagram of an exemplary noise canceling circuit, which may be utilized in connection with an embodiment of the invention.

FIG. 3A is a block diagram of an exemplary noise canceling circuit, which may be utilized in connection with an embodiment of the invention. Referring to FIG. 3A, there is shown a mixer 300, signal combiner 302, a pre-power amplifier (PA) amplifier 304, a circuit block 310, and a power amplifier 320. The mixer 300 may comprise suitable circuitry that may enable up-conversion of baseband signals to RF signals. The signal combiner 302 may comprise suitable circuitry that may enable combining of output TX1 from the mixer 300 with output TX3 from the circuit block 310. If the outputs TX1 and TX3 are currents, the signal combiner 302 may, for example, wire-OR the output TX1 and TX3.

The pre-PA amplifier 304 may comprise suitable logic and/or circuitry that may enable amplification of the output signal TX2 from the signal combiner 302. The circuit block 310 may comprise suitable circuitry that may enable extraction of noise signal, for example, the noise signal about the frequency 204. The power amplifier 320 may comprise suitable logic and/or circuitry that may enable amplification of RF signals for transmission via an antenna, such, as for example, the antenna 101.

In operation, an input signal TX-IN, which may be a baseband signal, may be up-converted to RF by the mixer 300, where the mixer 300 may use a local oscillator signal that may be a transmit RF center frequency. The output of the mixer 300 may be referred to as TX1. The RF signal TX1 may be combined with the output signal TX3 from the circuit block 310 to generate the RF signal TX2. The RF signal TX2 may be amplified by the pre-PA amplifier 304 to generate the RF signal TX-OUT. The RF signal TX-OUT may be, for example, further amplified and/or filtered by the transmitter front end 102 before being transmitted via the antenna 101. For example, the RF signal TX-OUT may be amplified by the power amplifier 320, the output of the power amplifier 320 may be communicated to the antenna 101 for transmission.

The RF signal TX-OUT may also be processed by the circuit block 310 to, for example, extract the RF noise about the RF frequency 204, which may be referred to as TX3. The RF noise TX3 may be combined with the RF signal TX1 to attenuate the noise about the RF frequency 204.

While single signals, such as, for example, TX-IN, TX1, TX2, TX3, TX-OUT, may have been shown for illustrative purposes, the circuitry in FIG. 3A may comprise, for example, in-phase (I) and quadrature (Q) components of the various signals, and/or differential I and Q signals.

Figure 3B:
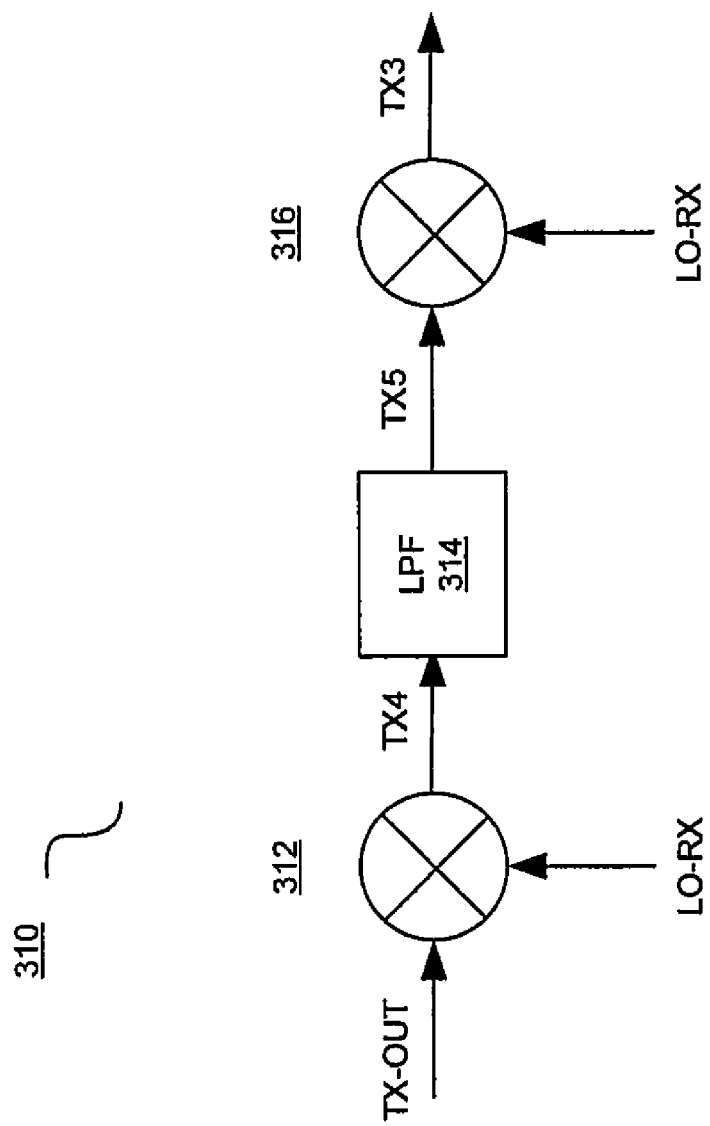
FIG. 3B is a block diagram of an exemplary circuit for extracting a desired signal, which may be utilized in connection with an embodiment of the invention.

FIG. 3B is a block diagram of an exemplary circuit for extracting a desired signal, which may be utilized in connection with an embodiment of the invention. Referring to FIG. 3B, there is shown the circuit block 310 that comprises mixers 312 and 316, and a low-pass filter 314. The mixer 312 may mix the RF signal TX-OUT with a local oscillator signal LO-RX, where the frequency of the local oscillator signal LO-RX may be the frequency 204. This may result in generating a baseband signal TX4 comprising noise about DC and signals to be transmitted about the frequency 214.

The baseband signal TX4 may be filtered by the low-pass filter 314 to generate the noise signal TX5. The noise signal TX5 may be those signals that, when up-converted to transmission frequencies, may be about the receive frequency 204. The noise signal TX5 may then be mixed by the mixer 316 with the local oscillator signal LO-RX, where the frequency of the local oscillator signal LO-RX may be the frequency 204. The output of the mixer 316 may be the RF signal TX3. While single signals, such as, for example, TX3, TX4, TX5, and TX-OUT, are shown for illustrative purposes, the circuitry in FIG. 3B may comprise, for example, in-phase (I) and quadrature (Q) components of the various signals, and/or differential I and Q signals.

FIGS. 4A-4D may describe circuitry that may be used to extract weak signals in the presence of strong unwanted signals, where the circuitry performs a highly linear and very low-noise down-conversion and appropriate filtering of the down-converted signal.

Figure 4A:
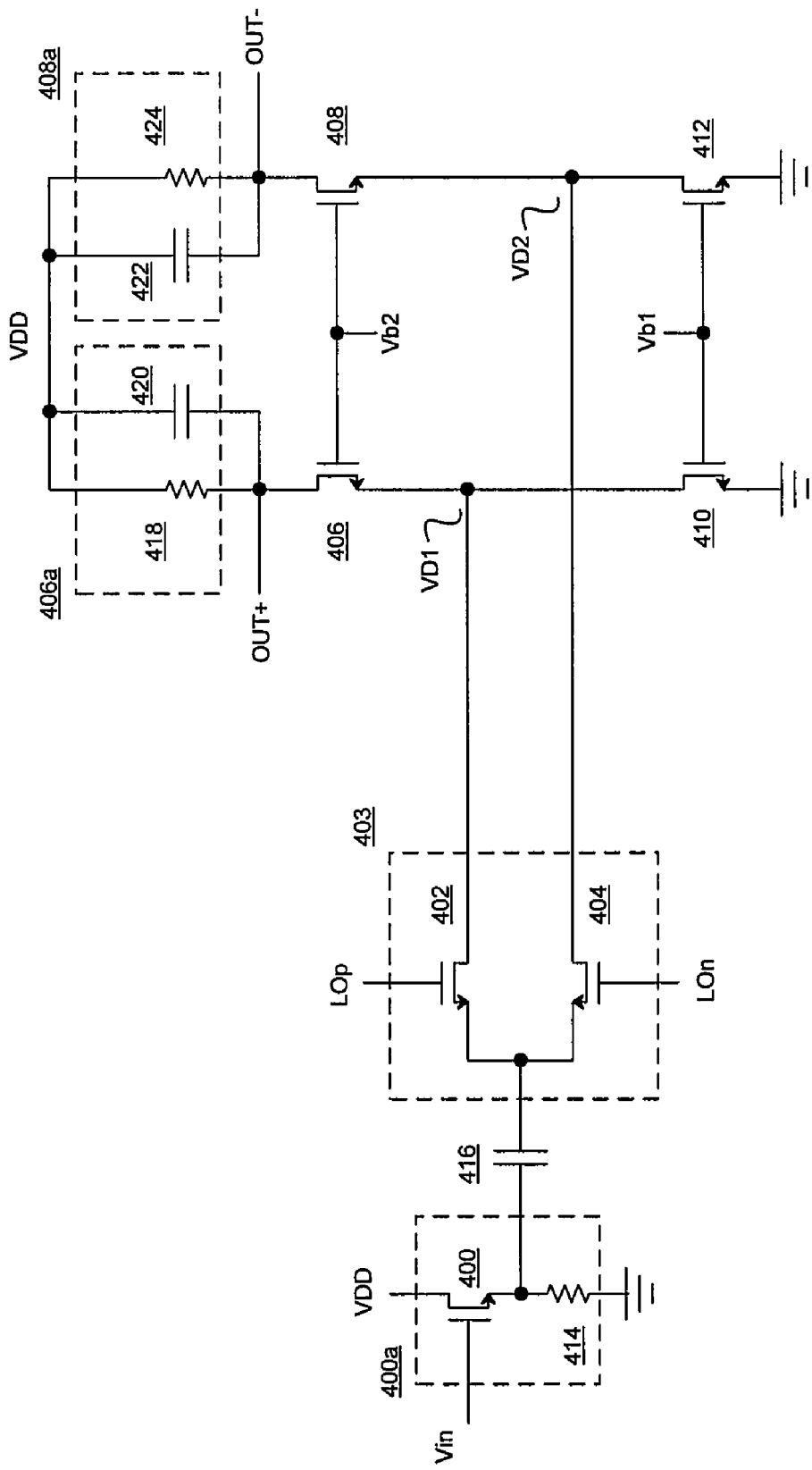
FIG. 4A is a diagram of an exemplary highly linear, low-noise circuit that may be used to extract a desired, weak signal in the presence of strong signals, in accordance with an embodiment of the invention.

FIG. 4A is a diagram of an exemplary highly linear, low-noise circuit that may be used to extract a desired, weak signal in the presence of strong signals, in accordance with an embodiment of the invention. Referring to FIG. 4, there is shown transistors 400, 402, 404, 406, 408, 410, and 412, resistors 414, 418, and 424, and capacitors 416, 420, and 422. The transistors 402 and 404 may comprise, for example, a switching circuit 403. The resistor 418 and the capacitor 420 may comprise, for example, a filter 406a. Similarly, the resistor 424 and the capacitor 422 may comprise, for example, a filter 408a.

The transistors 400, 402, 404, 406, 408, 410, and 412 may be, for example, NMOS transistors. The transistor 400 may be configured as a source follower where the output voltage may follow, for example, the input voltage. Accordingly, a source follower circuit 400a may comprise the transistor 400 and the resistor 414. The gate terminal of the transistor 400 may receive an input signal, which may be, for example, the RF signal TX-OUT described with respect to FIG. 3B. The drain terminal of the transistor 400 may be directly connected to a power source VDD, and the source terminal of the transistor 400 may be coupled to ground via the resistor 414. The source terminal of the transistor 400 may also provide an output voltage signal, which may follow the input voltage signal. Accordingly, the transistor 400 may act as a buffer that may not introduce non-linearities due to, for example, saturation.

The transistor 400 may be coupled to a first terminal of the capacitor 416, and a second terminal of the capacitor 416 may be coupled to source terminals of the transistors 402 and 404. Accordingly, the AC coupled signal at the sources of the transistors 402 and 404 may not have a DC current. Since there is no DC current, there may not be flicker noise generated by the transistors 402 and 404. The gates of the transistors 402 and 404 may have as inputs local oscillator signals LOp and LOn, which may be differential local oscillator signals. The differential local oscillator signals LOp and LOn may be used to down-convert, for example, the frequency of the input signal Vin, which may be AC coupled to the transistors 402 and 404, to baseband signals at the drain terminals of the transistors 402 and 404.

The baseband signals VD1 and VD2 may be output by the drain terminals of the transistors 402 and 404, respectively. These signals may be referred to as, for example, the baseband signal TX4, and may be communicated to the source terminals of the transistors 406 and 408, respectively, and to the drain terminals of the transistors 410 and 412, respectively. The baseband signals output by the drain terminals of the transistors 402 and 404 may be, for example, the baseband signal TX4, as described with respect to FIG. 3B. The transistors 410 and 412 may be configured as current sources for the transistors 406 and 408, respectively. The source terminals of the transistors 410 and 412 may be coupled to ground, and the gate terminals of the transistors 410 and 412 may receive a common input signal, for example, Vb1. The voltage of the common input signal Vb1 may be design and/or implementation dependent.

The transistors 406 and 408 may provide buffering and/or gain for the baseband signals generated by the transistors 402 and 404. The gate terminals of the transistors 406 and 408 may be provided a common input signal, for example, Vb2. The voltage of the common input signal Vb2 may be design and/or implementation dependent. The drain terminals of the transistors 406 and 408 may output signals OUT+ and OUT-, which may have been collectively referred to as, for example, the noise signal TX5 with respect to FIG. 3B.

The transistors 406, 408, 410, and 412 may be fabricated sufficiently large in size so that they may not generate enough flicker noise to noticeably affect the current flowing through the transistors. The amount of flicker noise allowed and the size of the transistors 406, 408, 410, and 412 may be design dependent.

The filters 406a and 406b may attenuate higher frequencies of the output signals OUT+ and OUT- at the drain terminals of the transistors 406 and 408. Accordingly, the attenuated higher frequencies of the output signals OUT+ and OUT- may comprise the frequencies of the RF signal TX-OUT that may be about the frequency 214. This may allow the signal strength of the output signals OUT+ and OUT-, or the noise signal TX5, to be more predominant at the lower frequencies about DC. The noise signal TX5 may be up-converted to generate the output signal TX3, as described with respect to FIG. 3B, and the output signal TX3 may be combined with the RF signal TX-OUT. Accordingly, the noise frequencies about the frequency 204 may be attenuated while minimizing attenuation of the signals about the transmit frequency 202.

FIG. 4B is a simplified diagram that shows an equivalent circuit for a portion of the exemplary highly linear, low-noise circuit shown in FIG. 4A. Referring to FIG. 4B, there is shown a circuit that comprises resistors 430 and 434, and a capacitor 432. The resistor 430 may represent, for example, an equivalent resistance seen at the source terminal of the transistor 400. The capacitor 432 may be, for example, the capacitor 416 that AC couples the output of the transistor 400 to the transistors 402 and 404. The resistor 434 may represent, for example, an equivalent resistance of the transistor 406 at the source terminal of the transistor 406. The baseband signal VD1 may be the output signal at the drain terminal of the transistor 410, which may be communicated to the source terminal of the transistor 406.

Accordingly, the voltage of the baseband signal VD1 may be described by the following equation:

$$VD1=(Vin)*(Rm2)/(Rm1+Rm2-jXc).$$

RM1 may be the resistance of the resistor 430, RM2 may be the resistance of the resistor 434, and $-jXc$ may be the impedance of the capacitor 432. Accordingly, since the voltage of the baseband signal VD1 may be smaller in value than the voltage of the input signal Vin, the output of the transistor 406 OUT+ may not have any issues related to linearity due to, for example, saturation of an amplifying transistor.

A similar description may also apply to the portion of the circuitry involving the transistors 400, 404, and 408, and the capacitor 416. Accordingly, the output voltage VD2 may be described by the following equation:

$$VD2=(Vin)*(Rm3)/(Rm1+Rm3-jXc),$$

where Rm3 may be the equivalent resistance of the transistor 408 at the source terminal of the transistor 408. Since the transistors 406 and 408 may be fabricated to be similar, the resistance Rm3 may be similar to the resistance Rm2. Accordingly, the amplitude of the baseband signal VD1 may be equal to the amplitude of baseband signal VD2. The ratio of VD1/Vin may be design and/or implementation dependent.

FIG. 4C is a simplified diagram that shows an equivalent circuit for a portion of the exemplary highly linear, low-noise circuit shown in FIG. 4A. Referring to FIG. 4C, there is shown a current source 440, a resistor 442, and a capacitor 444. The current source 440 may comprise, for example, a current ID1, which may be the current through the transistor 406, and the output signal OUT+. The resistor 442 and the capacitor 444 may comprise, for example, the filter 406a. Accordingly, the current ID1 may be filtered by the filter 406a, thereby attenuating higher frequency components from the output signal OUT+. The current though the transistor 408 may be similarly filtered by the filter 408a, where the output signal OUT− may also comprise attenuation of higher frequency components. The attenuation at specific frequencies may be dependent on the values of the resistor 442 and the capacitor 444. These values may be design and/or implementation dependent.

FIG. 4D is an exemplary diagram that shows further filtering provided for the exemplary highly linear, low-noise circuit shown in FIG. 4A, in accordance with an embodiment of the invention. Referring to FIG. 4D, there is shown the capacitors 450 and 452 that may be coupled to the drain terminals of the transistors 402 and 404, respectively. The capacitors 402 and 404, in conjunction with the equivalent resistances of the transistors 406 and 408, may form a filter that may attenuate high frequency portions of the baseband signals VD1 and VD2.

In accordance with an embodiment of the invention, aspects of an exemplary system may comprise the source follower circuit 400a in the transmitter front end 102 of the mobile terminal 100. The source follower circuit 400a may receive RF signals prior to the RF signals being amplified for transmission by the power amplifier 320. The RF signals may comprise in-phase and quadrature components. A coupling capacitor 416 may communicate output RF voltage signals generated by the source follower circuit 400a to the switching circuit 403, where the switching circuit may comprise the transistors 402 and 404. The switching circuit 403 may generate differential output signals. The capacitance of the coupling capacitor 416 may be changed to control gain and/or linearity of the differential output signals.

The capacitors 450 and 452 may be coupled to the outputs of the transistors 402 and 404, respectively, to each of the differential outputs of the switching circuit 403. The capacitors 450 and 452 may act in conjunction, for example, with the input resistances at the source terminals of the transistors 406 and 408 to attenuate high frequency signals. The frequencies that may be filtered may be design and/or implementation dependent.

The mobile terminal 100 may operate, for example, in accordance with at least a CDMA standard. Accordingly, the switching circuit 403 may down-convert the output RF voltage signals, communicated from the transistor 400 via the transistor 416, to baseband signals. The switching circuit 403 may use, for example, local oscillator signals that may allow down-conversion of the frequency 204 to DC. The frequency 204 may be, for example, the receive frequency for a CDMA mobile terminal.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will comprise all embodiments falling within the scope of the appended claims.

What is claimed is:

1. A method for processing electrical signals, the method comprising:

in a mobile terminal having a transmitter front end comprising a source follower circuit, receiving RF signals by said source follower circuit prior to amplification of said RF signals by one or more power amplifiers; and generating by said source follower circuit, output voltage signals that are communicated to a switching circuit via one or more coupling capacitors.

2. The method according to claim 1, wherein said RF signals comprise in-phase and quadrature components.

3. The method according to claim 1, comprising generating differential baseband signals by said switching circuit, wherein said communicated output RF voltage signals are inputs to said switching circuit.

4. The method according to claim 3, comprising filtering each of said differential outputs of said switching circuit with a low pass filter, wherein said low pass filter comprises a filtering capacitor.

5. The method according to claim 1, wherein said mobile terminal operates in accordance with at least a CDMA standard.

6. The method according to claim 5, comprising down-converting said communicated output RF voltage signals to baseband signals, wherein a receive frequency for said mobile terminal is down-converted to DC.

7. The method according to claim 1, comprising controlling one or both of gain and linearity of an output of said source follower circuit.

8. The method according to claim 1, comprising changing a capacitance of said one or more coupling capacitors to control said one or both of said gain and said linearity of output of said source follower circuit.

9. A system for processing electrical signals, the system comprising:
a source follower circuit in a transmitter front end of a mobile terminal, said source follower circuit enables reception of RF signals prior to said RF signals being amplified by one or more power amplifiers; and
one or more coupling capacitors that enable communication of output RF voltage signals generated by said source follower circuit, to a switching circuit.

10. The system according to claim 9, wherein said RF signals comprise in-phase and quadrature components.

11. The system according to claim 9, wherein said switching circuit generates differential outputs from said communicated output RF voltage signals.

12. The system according to claim 11, comprising a low-pass filter coupled to each of said differential outputs of said switching circuit, wherein said low pass filter comprises a filtering capacitor.

13. The system according to claim 9, wherein said mobile terminal operates in accordance with at least a CDMA standard.

14. The system according to claim 13, wherein said switching circuit enables down-conversion of said communicated output RF voltage signals to baseband signals, wherein a receive frequency for said mobile terminal is down-converted to DC.

15. The system according to claim 9, wherein one or both of gain and linearity of an output of said source follower circuit is controlled.

16. The system according to claim 9, wherein a capacitance of each of said one or more coupling capacitors is changed to control said one or both of gain and said linearity of output of said source follower circuit.

17. A transistor circuit for processing electrical signals, comprising:
a source terminal of a first transistor directly electrically connected to a first terminal of a coupling capacitor, and a second terminal of said coupling capacitor directly electrically connected to a source terminal of a second transistor and to a source terminal of a third transistor;
a drain terminal of said second transistor directly electrically connected to a source terminal of a fourth transistor and to a drain terminal of a fifth transistor; and
a drain terminal of said third transistor directly electrically connected to a source terminal of a sixth transistor and to a drain terminal of a seventh transistor.

18. The system according to claim 17, wherein a gate terminal of said first transistor is supplied with an input RF voltage, said source terminal of said first transistor is directly electrically connected to a first terminal of a first resistive device, a second terminal of said first resistive device is directly electrically connected to ground, and a drain terminal of said first transistor is directly electrically connected to a higher voltage rail of a power supply.

19. The system according to claim 17, wherein a gate terminal of said second transistor is supplied with first local oscillator signals for down-converting signals at said source terminal of said second transistor, and a gate terminal of said third transistor is supplied with second local oscillator signals for down-converting signals at said source terminal of said third transistor.

20. The system according to claim 19, wherein said first local oscillator signals and said second local oscillator signals are differential signals.

21. The system according to claim 17, wherein output signals at said drain terminal of said second transistor and output signals at said drain terminal of said third transistor are differential signals.

22. The system according to claim 17, wherein said fifth transistor and said seventh transistor are configured as current sources for said fourth transistor and said sixth transistor, respectively.

23. The system according to claim 17, comprising a first terminal of a first low pass filter directly electrically connected to a drain terminal of said fourth transistor, a first terminal of a second low pass filter directly electrically connected to a drain terminal of said sixth transistor, and second terminals for said first low pass filter and said second first low pass filter are directly electrically connected to a higher voltage rail of a power supply.

24. The system according to claim 23, wherein said first low pass filter and said second low pass filter each comprise a resistive device in parallel with a capacitive device.

25. The system according to claim 17, wherein a gate terminal of said fourth transistor and a gate terminal of said sixth transistor are controlled by a common signal.

26. The system according to claim 17, wherein a gate terminal of said fifth transistor and a gate terminal of said seventh transistor are controlled by a common signal.

27. The system according to claim 17, wherein a drain terminal of said fourth transistor and a drain terminal of said sixth transistor output differential signals.

28. The system according to claim 17, wherein a source terminal of said fifth transistor and a source terminal of said seventh transistor are directly electrically connected to ground.

* * * * *